US012083705B2

(12) United States Patent
Beyer et al.

(10) Patent No.: US 12,083,705 B2
(45) Date of Patent: *Sep. 10, 2024

(54) METHOD FOR PRODUCING SEMICONDUCTOR WAFERS USING A WIRE SAW, WIRE SAW, AND SEMICONDUCTOR WAFERS MADE OF MONOCRYSTALLINE SILICON

(71) Applicant: SILTRONIC AG, Munich (DE)

(72) Inventors: Axel Beyer, Munich (DE); Stefan Welsch, Polling (DE)

(73) Assignee: SILTRONIC AG, Munich (DE)

( * ) Notice: Subject to any disclaimer, the term of this patent is extended or adjusted under 35 U.S.C. 154(b) by 539 days.

This patent is subject to a terminal disclaimer.

(21) Appl. No.: 17/414,680

(22) PCT Filed: Dec. 12, 2019

(86) PCT No.: PCT/EP2019/084802
§ 371 (c)(1),
(2) Date: Jun. 16, 2021

(87) PCT Pub. No.: WO2020/126787
PCT Pub. Date: May 25, 2020

(65) Prior Publication Data
US 2022/0040882 A1 Feb. 10, 2022

(30) Foreign Application Priority Data
Dec. 17, 2018 (DE) ..................... 10 2018 221 922.2

(51) Int. Cl.
*B28D 5/04* (2006.01)
*B24B 27/06* (2006.01)
(Continued)

(52) U.S. Cl.
CPC ........ *B28D 5/0064* (2013.01); *B24B 27/0633* (2013.01); *B28D 5/0082* (2013.01);
(Continued)

(58) Field of Classification Search
None
See application file for complete search history.

(56) References Cited

U.S. PATENT DOCUMENTS 2,986,136 A * 5/1961 Wayland ............ B23D 57/0053
474/178
3,942,508 A * 3/1976 Shimizu ................ B28D 5/045
125/21
(Continued)

FOREIGN PATENT DOCUMENTS

CN 101393856 A * 3/2009
CN 101607422 A * 12/2009 ............. B28D 1/124
(Continued)

OTHER PUBLICATIONS

Machine Translation of JP-09109143-A, Apr. 1997 (Year: 1997).*
(Continued)

*Primary Examiner* — Jeffrey A Vonch
(74) *Attorney, Agent, or Firm* — BROOKS KUSHMAN P.C.

(57) ABSTRACT

Semiconductor wafers are produced from a workpiece by means of a wire saw, by feeding the workpiece through an arrangement of wires tensioned between wire guide rollers and divided into wire groups, the wires moving in a running direction producing kerfs as wires engage the workpiece. For each of the wire groups, a placement error of the kerfs of the wire groups determined, and for each of the wire groups compensating movements of the wires of the wire group are induced as a function of the placement error, in a direction perpendicular to the running direction of the wires
(Continued)

during feeding of the workpiece through the arrangement of wires, by activating at least one drive element.

11 Claims, 10 Drawing Sheets

(51) Int. Cl.
    *B28D 5/00*        (2006.01)
    *H01L 21/67*      (2006.01)
    *B23D 59/00*      (2006.01)
    *B28D 7/00*       (2006.01)
    *H01L 21/02*      (2006.01)

(52) U.S. Cl.
    CPC ........ *B28D 5/045* (2013.01); *H01L 21/67092* (2013.01); *H01L 21/67253* (2013.01); *B23D 59/00* (2013.01); *B28D 5/00* (2013.01); *B28D 5/0058* (2013.01); *B28D 5/007* (2013.01); *B28D 5/04* (2013.01); *B28D 7/00* (2013.01); *H01L 21/0201* (2013.01)

(56) References Cited

U.S. PATENT DOCUMENTS

| | | | | |
|---|---|---|---|---|
| 5,036,274 A * | 7/1991 | Seeburger | ............ | B23D 59/002 324/207.16 |
| 5,154,022 A * | 10/1992 | Chalco | ................ | B24B 27/0633 451/36 |
| 5,564,409 A * | 10/1996 | Bonzo | .................... | B28D 5/045 125/16.02 |
| 5,575,189 A * | 11/1996 | Kiuchi | ............... | B23D 57/0053 125/16.02 |
| 5,616,065 A | 4/1997 | Egglhuber | | |
| 5,720,271 A * | 2/1998 | Hauser | ................ | B28D 5/0088 125/16.02 |
| 5,778,869 A * | 7/1998 | Toyama | ............. | B23D 57/0053 125/16.02 |
| 5,875,770 A | 3/1999 | Fukunaga | | |
| 5,893,308 A * | 4/1999 | Katamachi | ........... | B23Q 16/001 83/13 |
| 6,041,766 A * | 3/2000 | Vojtechovsky | ........ | B28D 5/045 125/16.02 |
| 6,098,610 A * | 8/2000 | Egglhuber | ......... | B23D 57/0053 125/16.02 |
| 6,107,163 A * | 8/2000 | Kojima | ............... | H01L 21/3043 438/464 |
| 6,178,961 B1 * | 1/2001 | Nagatsuka | ........... | B28D 5/0064 125/16.02 |
| 6,279,564 B1 * | 8/2001 | Hodsden | .............. | B23D 61/185 125/16.02 |
| 6,371,101 B1 * | 4/2002 | Hauser | .................... | B28D 5/045 83/651.1 |
| 6,408,839 B1 * | 6/2002 | Hauser | ................ | B23D 57/0023 125/16.02 |
| 6,652,356 B1 * | 11/2003 | Ariga | ..................... | B28D 5/045 125/16.02 |
| 8,256,407 B2 | 9/2012 | Kawasaki et al. | | |
| 2001/0004891 A1 * | 6/2001 | Holzmuller | .......... | B28D 5/0082 125/21 |
| 2002/0174861 A1 * | 11/2002 | Lundt | .................. | B28D 5/0064 125/21 |
| 2003/0170948 A1 * | 9/2003 | Bhagavat | .............. | B28D 5/0076 438/200 |
| 2004/0168682 A1 * | 9/2004 | Hammer | .............. | B28D 5/0088 125/16.01 |
| 2007/0178807 A1 * | 8/2007 | Gupta | .................. | B28D 5/0076 451/41 |
| 2007/0243695 A1 * | 10/2007 | Iida | ......................... | B28D 5/04 438/460 |
| 2008/0166948 A1 | 7/2008 | Bhagavat et al. | | |
| 2008/0318395 A1 * | 12/2008 | Farnworth | ............ | H01L 22/20 257/E21.702 |
| 2009/0288530 A1 * | 11/2009 | Oishi | ..................... | B28D 5/007 83/22 |
| 2009/0288651 A1 * | 11/2009 | Brocco | ............. | B23D 57/0053 125/1 |
| 2009/0320658 A1 * | 12/2009 | Yazawa | ............... | B23D 57/0038 83/13 |
| 2010/0006082 A1 * | 1/2010 | Glinski | .................. | B28D 5/045 125/16.02 |
| 2010/0051009 A1 * | 3/2010 | Modler | ................. | B28D 5/045 83/72 |
| 2010/0163010 A1 * | 7/2010 | Kitagawa | ............. | B28D 5/0064 451/60 |
| 2010/0180880 A1 * | 7/2010 | Oishi | ................. | B23D 57/0046 125/16.02 |
| 2010/0300423 A1 * | 12/2010 | Oshima | ............... | B28D 5/0076 125/21 |
| 2012/0178346 A1 * | 7/2012 | Wiesner | ............... | B28D 5/0076 451/54 |
| 2012/0240915 A1 * | 9/2012 | Huber | ............. | B23D 57/0053 125/21 |
| 2012/0319129 A1 * | 12/2012 | Matsumoto | ........... | C30B 29/406 257/E29.089 |
| 2013/0061842 A1 * | 3/2013 | Junge | .................... | B28D 5/045 125/21 |
| 2013/0139800 A1 * | 6/2013 | Zavattari | .............. | B28D 5/045 125/12 |
| 2013/0139801 A1 * | 6/2013 | Zavattari | .............. | B28D 5/0064 125/12 |
| 2013/0144420 A1 * | 6/2013 | Zavattari | .............. | B28D 5/0064 125/12 |
| 2013/0174829 A1 * | 7/2013 | Bhagavat | .............. | B28D 5/045 125/21 |
| 2014/0295126 A1 * | 10/2014 | Noguchi | .................. | B28D 1/08 428/64.1 |
| 2015/0004799 A1 | 1/2015 | Tanaka et al. | | |
| 2015/0083104 A1 * | 3/2015 | Pietsch | .................. | B28D 5/045 125/21 |
| 2015/0214123 A1 * | 7/2015 | Shimizu | ................ | H01L 22/12 438/10 |
| 2015/0283727 A1 * | 10/2015 | Reinhardt | .......... | B23D 57/0023 125/21 |
| 2015/0314484 A1 * | 11/2015 | Pietsch | .................. | B28D 5/045 125/21 |
| 2016/0243725 A1 * | 8/2016 | Sillard | ................ | G05B 19/418 |
| 2017/0239842 A1 * | 8/2017 | Lei | ........................ | B28D 5/042 |
| 2018/0056545 A1 * | 3/2018 | Albrecht | ........... | G05B 19/042 |
| 2018/0229320 A1 * | 8/2018 | Miyake | ................. | B23H 7/105 |
| 2019/0145750 A1 | 5/2019 | Deschler et al. | | |
| 2019/0275701 A1 * | 9/2019 | Ly | .......................... | B28D 5/045 |
| 2019/0333775 A1 * | 10/2019 | Nishitani | ............. | B24B 37/013 |
| 2021/0114257 A1 * | 4/2021 | Kanbayashi | ........... | B28D 5/045 |
| 2021/0170510 A1 * | 6/2021 | Chi | .......................... | B27B 5/12 |
| 2021/0362373 A1 * | 11/2021 | Mizushima | ......... | B24B 27/0633 |
| 2022/0040882 A1 | 2/2022 | Beyer et al. | | |
| 2022/0040883 A1 * | 2/2022 | Beyer | ..................... | B28D 5/04 |

FOREIGN PATENT DOCUMENTS

| | | | | |
|---|---|---|---|---|
| CN | 101817209 A | * | 9/2010 | |
| CN | 102211362 A | * | 10/2011 | |
| CN | 102229092 A | * | 11/2011 | |
| CN | 102672291 A | * | 9/2012 | |
| CN | 103025465 A | | 4/2013 | |
| CN | 103144208 A | * | 6/2013 | |
| CN | 107036750 A | * | 8/2017 | |
| CN | 206367102 U | * | 8/2017 | |
| CN | 107283012 A | * | 10/2017 | ............ B23H 11/00 |
| CN | 108214955 A | * | 6/2018 | ........... B28D 5/0064 |
| CN | 108608591 A | * | 10/2018 | ............... B28D 5/04 |
| CN | 212218918 U | | 12/2020 | |
| DE | 10232667 A1 | * | 2/2004 | ........ B23D 57/0053 |
| DE | 102013206520 A1 | * | 10/2014 | ........ B23D 57/0023 |
| DE | 112016005417 T5 | | 8/2018 | |
| EP | 827798 A1 | * | 3/1998 | ......... B23D 57/0053 |
| EP | 1555101 A1 | * | 7/2005 | ......... B23D 57/0046 |
| EP | 2353806 A1 | * | 8/2011 | ............. B26D 1/553 |
| EP | 2361710 A1 | * | 8/2011 | ......... B23D 57/0023 |

(56) References Cited

FOREIGN PATENT DOCUMENTS

| | | | | |
|---|---|---|---|---|
| EP | 2583778 A1 | * | 4/2013 | ........... B23D 59/002 |
| EP | 2586582 A1 | * | 5/2013 | ........... B28D 5/0064 |
| JP | 60197361 A | * | 10/1985 | ............. B28D 5/045 |
| JP | 06155279 A | * | 6/1994 | |
| JP | 08267446 A | * | 10/1996 | ......... B23D 57/0046 |
| JP | 9H0109143 | | 4/1997 | |
| JP | 09109143 A | * | 4/1997 | ........... B23D 59/002 |
| JP | 11165251 A | * | 6/1999 | ........... B28D 5/0064 |
| JP | 2000084826 A | * | 3/2000 | ......... B23D 57/0053 |
| JP | 2001328057 A | * | 11/2001 | |
| JP | 2002254284 A | * | 9/2002 | |
| JP | 2003145406 A | * | 5/2003 | |
| JP | 2004306536 A | * | 11/2004 | |
| JP | 2005014126 A | * | 1/2005 | |
| JP | 2005103683 A | * | 4/2005 | |
| JP | 2007210068 A | * | 8/2007 | |
| JP | 2008213110 A | * | 9/2008 | ........... B28D 5/0064 |
| JP | 200961527 A | | 3/2009 | |
| JP | 2011194560 A | * | 10/2011 | .......... B24B 27/0633 |
| JP | 1912464 B2 | | 1/2012 | |
| JP | 2012236256 A | * | 12/2012 | |
| JP | 2012250329 A | * | 12/2012 | |
| JP | 2014213429 A | * | 11/2014 | |
| JP | 2015047673 A | * | 3/2015 | |
| JP | 2016076601 A | * | 5/2016 | |
| JP | 2016203318 A | * | 12/2016 | |
| JP | 201787395 A | | 5/2017 | |
| JP | 2017087395 A | * | 5/2017 | |
| KR | 1020180067657 A | | 6/2018 | |
| KR | 1020180126000 A | | 11/2018 | |
| TW | 353781 A | | 3/1995 | |
| WO | 2011161713 A1 | | 12/2011 | |
| WO | WO-2014167392 A1 | * | 10/2014 | ........... B23D 59/002 |
| WO | 2015188859 A1 | | 12/2015 | |
| WO | WO-2020120777 A1 | * | 6/2020 | ........... A61B 5/7239 |

OTHER PUBLICATIONS

Machine Translation of JP-11165251-A, Jun. 1999 (Year: 1999).*
Machine Translation of DE-10232667-A1, Feb. 2004 (Year: 2004).*
Machine Translation of CN-101817209-A, Sep. 2010 (Year: 2010).*
Machine Translation of JP-2016076601-A, May 2016 (Year: 2016).*

* cited by examiner

METHOD FOR PRODUCING SEMICONDUCTOR WAFERS USING A WIRE SAW, WIRE SAW, AND SEMICONDUCTOR WAFERS MADE OF MONOCRYSTALLINE SILICON

CROSS REFERENCE TO RELATED APPLICATIONS

This application is the U.S. National Phase of PCT Appln. No. PCT/EP2019/084802 filed Dec. 12, 2019, which claims priority to German Application No. 10 2018 221 922.2 filed Dec. 17, 2018, the disclosures of which are incorporated in their entirety by reference herein.

BACKGROUND OF THE INVENTION

1. Field of the Invention

The invention relates to a method for producing semiconductor wafers from a workpiece by processing the workpiece by means of a wire saw, to a wire saw for carrying out the method, and to a semiconductor wafer of monocrystalline silicon obtained by the method.

2. Description of the Related Art

A wire saw and the functional principles thereof are described in detail in WO 2015/188 859 A1.

JP 09 109 143 A discloses a method for producing wafers from a workpiece (ingot) by means of a wire saw, which comprises the following steps: detecting the position of wires of a wire field of the wire saw and, when there is a deflection of the wires, inducing a compensating movement of a wire guide roller in order to correct the deflection.

JP 11 165 251 discloses a similar method, which comprises the following steps: detecting the position of wires of a wire field of the wire saw and, when there is a deflection of the wires, inducing a compensating movement of the workpiece.

U.S. Pat. No. 5,875,770 discloses a similar method, which comprises the following steps: detecting the warp of wafers before processing the workpiece, and inducing a compensating movement of the workpiece along an axial direction of the workpiece in a scope such that wafers with reduced warp are formed.

JP 2009 61 527 A discloses a similar method, which takes account of the fact that the workpiece may move axially because of thermal expansion, by providing means to permit the wire guide rollers a compensating movement.

Regardless of these available solutions, there is still a need for improvement of the method for producing semiconductor wafers from a workpiece by means of a wire saw. In particular, it is to be taken into account that the axial movement of the workpiece because of thermal expansion can be compensated for only approximately by a corresponding axial movement of the wire guide rollers. Furthermore, regulation of the axial positions of the wires by means of the temperature of the wire guide rollers is relatively slow. Furthermore, the measured warp of wafers from a workpiece processed previously can only approximately describe deviations for a workpiece yet to be processed, and the axial movement of an entire workpiece can compensate for such deviations only partially.

In particular, improvement of the method is required so that semiconductor wafers may be obtained whose planarity, particularly in relation to warp and nanotopography, is better than that of wafers which are produced in a known way.

The described problems have given rise to the object of the invention.

SUMMARY OF THE INVENTION

The object of the invention is achieved by a method for producing semiconductor wafers from a workpiece by processing the workpiece by means of a wire saw, comprising
feeding the workpiece through an arrangement of wires which are tensioned between wire guide rollers while being divided into wire groups and move in a running direction;
producing kerfs when the wires engage into the workpiece;
for each of the wire groups, determining a placement error of the kerfs of the wire group; and
for each of the wire groups, inducing compensating movements of the wires of the wire group as a function of the determined placement error of the kerfs of the wire group in a direction perpendicular to the running direction of the wires of the wire group during the feeding of the workpiece through the arrangement of wires by activating at least one drive element.

DETAILED DESCRIPTION OF THE PREFERRED EMBODIMENTS

Figure 1:
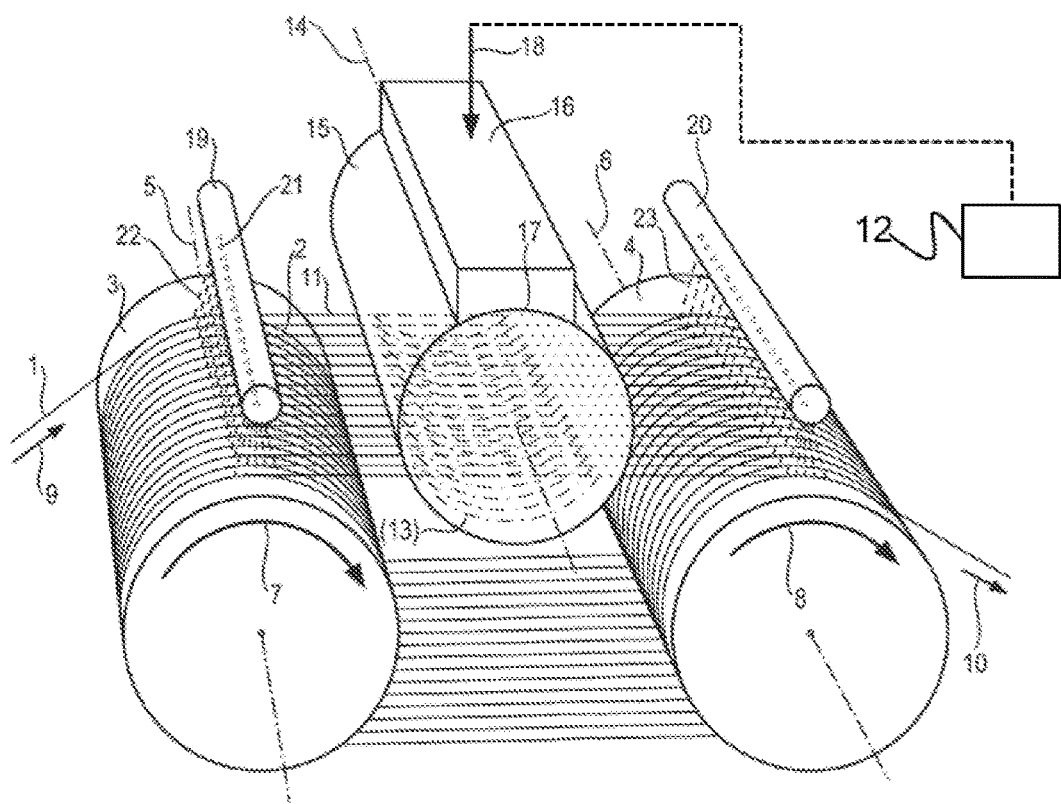
FIG. 1 shows main features of a wire saw belonging to the prior art.

At least two wire groups are provided, preferably at least three wire groups, and more preferably four wire groups, although it is also possible for each wire to be regarded as a separate wire group i.e. the number of wire groups corresponds to the number of wires in the arrangement of wires (wire web). Wire groups preferably have the same axial width and the distance between neighboring wires of a wire group is the same.

According to the invention, for each of the wire groups, separate compensating movements of the wires of the wire group are induced in a direction perpendicular to the running direction of the wires of the wire group, i.e. in the direction of the rotation axes of the wire guide rollers. To this end, at least one drive element is activated, which displaces the wires in the intended direction and over the intended distance. The compensating movements of the wires of the wire group are induced independently of optionally simultaneously performed inducing of compensating movements of the wires of another wire group.

As a drive element, in particular, electromagnetic, mechanical, hydraulic, pneumatic, magnetostrictive and preferably piezoelectric actuators may be envisioned. If the wires are divided into four wire groups, for example, the wire groups form two inner and two outer wire groups. If the workpiece expands because of heat, the placement error of a kerf which is to be assigned to a wire of one of the inner wire groups is less than that which is to be assigned to a wire of one of the outer wire groups. Correspondingly, the magnitudes of the compensating movements of the wires of the outer wire groups must be selected to be greater than the magnitude of the compensating movements of the wires of the inner wire groups. In the event that each wire is regarded as a separate wire group, each wire is subjected to a compensating movement with its own magnitude and its own direction.

A semiconductor wafer cut from a workpiece has an upper and a lower side surface and an edge extending between the two. It is conventionally desired that, after cutting from the workpiece, the upper and the lower side surface are as planar as possible and have a maximally uniform distance from one another. The better the planarity of the side surfaces and the uniformity of the thickness of the semiconductor wafer at the start, the greater the success and the lower the outlay of refining the semiconductor wafer by subsequent steps such as lapping and/or grinding, etching, polishing and optionally coating to form a target product which meets the stringent requirements of the industry which processes the semiconductor wafer further to form electronic components. The upper side surface is also referred to as the front side of the semiconductor wafer, and is generally that surface on or into which the intention is to apply structures of electronic components in the course of further processing of the semiconductor wafer.

The present invention has the aim, when processing the workpiece by means of a wire saw, of ensuring that kerfs, whose placement deviates as little as possible from a placement regarded as ideal, are formed in the workpiece. If semiconductor wafers with a uniform thickness and maximally planar side surfaces are sought, an ideal kerf extends in a straight line and at a right angle to the longitudinal axis of the workpiece. In other words, the trajectory through the middle of such a kerf extends along a straight line which is oriented perpendicularly to the longitudinal axis of the workpiece. Such a trajectory will be referred to below as the target trajectory. Accordingly, there is a placement error of a kerf when the actual trajectory deviates from the target trajectory. This is the case when a position vector that points to the middle of the kerf no longer ends at the target trajectory.

A placement error of a kerf occurs, for example, when a wire moves perpendicularly to its running direction during its engagement into the workpiece, i.e. in the direction of the rotation axes of the wire guide rollers between which it is tensioned, or when the workpiece axially expands because of the development of heat during the feeding through the arrangement of wires. The placement error of a kerf is in the latter case commensurately greater when the kerf has a greater distance from the middle of the workpiece. The middle of the workpiece is the position between the two ends of the workpiece.

It is one aspect of the invention, for each wire group separately, to determine the placement error of the kerfs irrespective of the reason which has led to a relative movement between the workpiece and the wire group. Examples of such reasons are movement of the wire group, movement of the workpiece or thermal expansion of the workpiece. It is another aspect of the present invention to distinguish between a placement error of the kerfs which occurs systematically when using a particular wire saw and a placement error of the kerfs which occurs randomly and independently of the use of a particular wire saw.

Expediently, for each wire group separately, at least one closed control loop is set up, in which a control deviation, i.e. an ascertained placement error of the kerfs of the wire group, is responded to with a modification of the manipulated variable, i.e. the inducing of a compensating movement of the wires of the wire group.

According to a first configuration of the method according to the invention, the determination of the placement error of the kerfs of the wire group is carried out for each wire group separately during the feeding of the workpiece through the arrangement of wires. According to a first alternative of the first configuration, preferably, the position of each kerf relative to a fixed reference point is measured and compared with a setpoint position. The setpoint position of a kerf is the position relative to the fixed reference point which would be required for an ideal kerf to be formed. The deviation of the measured position of the kerf from its setpoint position corresponds to the placement error of the kerf. Since the deviation is in principle different for each kerf of the wire group, the deviations are averaged to give a placement error which is representative of the placement error of the kerfs of the wire group. In other words, each kerf of the wire group is assigned the same averaged placement error. The averaging may be carried out without weighting, or placement errors of particular kerfs are specially weighted. From the placement error of the kerfs of the wire group, a correction profile may be derived which specifies the magnitude and direction with which the wires of the wire group must be moved during the feeding of the workpiece in order to eliminate the placement error of the kerfs. The correction profile has, considered over the penetration depth of the wires into the workpiece, a profile which is complementary to the profile of the ascertained placement error of the kerfs of the wire group.

The measurement of the position of the kerfs of the wire group is preferably carried out by means of irradiating the kerfs of the wire group with optical radiation, IR radiation, X-radiation or γ radiation. Furthermore, mechanical sensing of the kerfs of the wire group or inductive or capacitive measurement of the kerfs of the wire group may also be envisioned. Such direct observation of the kerfs of the wire group reveals any relative movement between the workpiece and the wires of the wire group.

According to a second alternative of the first configuration, preferably the position of each wire of a wire group and of the workpiece relative to a fixed reference point is simultaneously measured and compared with a setpoint position, in order to record such a relative movement. Since the deviation is in principle different for each wire of the wire group, the deviations are averaged to give a placement error which is representative of the placement error of the wires of the wire group. In other words, each wire of the wire group is assigned the same averaged placement error. The averaging may be carried out without weighting, or placement errors of particular kerfs are specially weighted. The setpoint position of the wire is the position of the wire relative to the fixed reference point which would be required for an ideal kerf to be formed. The same applies for the setpoint position of the workpiece. From the sum of the measured deviations from the setpoint positions of the wire and workpiece, the deviation of the actual trajectory from the target trajectory is determined approximately.

The measurement of the position of the wires of the wire group, or of the position of the workpiece, is carried out by means of irradiating the wires of the wire group, or respectively the workpiece, with optical radiation, IR radiation, X-radiation or γ radiation, or by means of capacitive or inductive measurement. Furthermore, mechanical sensing of the wires of the wire group, or respectively of the workpiece, or inductive or capacitive measurement of the wires of the wire group, or respectively of the workpiece, may also be envisioned. The position of the workpiece may be determined relative to end surfaces of the workpiece, and preferably relative to reference points marked on the workpiece.

According to a second configuration of the method according to the invention, the determination of the placement error of the kerfs of the wire group is carried out for each wire group separately before the feeding of the workpiece through the arrangement of wires. By virtue of this procedure, a placement error of the kerfs which occurs systematically when using a particular wire saw is determined. In order to determine the placement error of the kerfs, the local geometry of semiconductor wafers which have been produced beforehand by means of a particular wire saw is measured. These semiconductor wafers come from one or more workpieces which have been processed by means of this wire saw, specifically by means of wires of the wire group for which the placement error of the kerfs is being determined. The local geometry of a semiconductor wafer approximately replicates the trajectory of the kerf next to the semiconductor wafer. Preferably, the local geometry of the median surface of a warp measurement according to SEMI MF 1390-0218 is obtained, specifically as follows: a height line (line scan, LS) is produced by selecting those measurement values of the median surface which lie on a line that extends through the center of the semiconductor wafer. The measurement values lie on a line that follows a diameter of the semiconductor wafer, preferably in the direction of the feeding of the workpiece when cutting the semiconductor wafer, or deviates from such a direction at least by no more than ±20°.

In order to identify a placement error of the kerfs which occurs systematically when using a particular wire saw, the local geometry of the semiconductor wafers which come from one or more workpieces that have been processed by means of this wire saw and have been produced by means of wires of the wire group is averaged to give a single local geometry. The averaging may be carried out without weighting, or the local geometry of particular semiconductor wafers is specially weighted because of their relative placement in the workpiece. On the basis of the averaged local geometry, it is then deduced how the trajectory of the kerfs will be if the particular wire saw is used and other influences that affect the trajectory are neglected. Such a trajectory will subsequently be referred to as the expected trajectory. The placement error of the kerfs of the wire group, which is to be expected during the feeding of the workpiece, is obtained from comparison of the expected trajectory with the target trajectory. The comparison gives a wire saw-specific correction profile, which specifies the direction and magnitude of the compensating movements of the wires of the wire group as a function of the penetration depth of the wires into the workpiece during the feeding of the workpiece through the arrangement of wires. The profile of the wire saw-specific correction profile is in principle complementary to the profile of the averaged local geometry.

The wire saw-specific correction profile is preferably also used in order to be able to promptly identify changes in the performance of the wire saw and respond thereto. Changes in the wire saw-specific correction profile which occur in the course of the processing of workpieces indicate wear of the wire and/or of the coating of the wire guide rollers or of another component of the wire saw which is subject to wear. A threshold may therefore be defined for the change in the wire saw-specific correction profile, with predictive maintenance measures being initiated when this is reached. Even before reaching such a threshold, changes in the wire saw-specific correction profile may be taken as a reason to carry out adaptation measures which counteract a wear-related degradation of the working outcome. Such adaptation measures may, for example, involve changing the composition and/or the temperature of a cutting medium suspension or changing the temperature of a coolant, as well as changing the wire speed or other process-specific parameters.

A third configuration of the invention involves combining the first and second configurations. A first part of the compensating movements of the wires of the wire group is induced on the basis of a correction profile which is determined according to the first configuration of the invention in real time during the feeding of the workpiece as a function of the penetration depth of the wires of the wire group. A further part of the compensating movements of the wires of the wire group is induced on the basis of a wire saw-specific correction profile which has been determined according to the second configuration of the invention before the feeding of the workpiece through the arrangement of wires for the respective wire group. Randomly occurring and therefore unpredictable influences on the placement error of the kerfs, as well as those which occur systematically because of the use of a particular wire saw, are therefore taken into account separately from one another.

A wire saw-specific correction profile may, of course, also be obtained by recording the correction profile which is derived according to the first configuration of the method according to the invention.

The present invention may be used in conjunction with wires which comprise abrasive grain fixed on the wire, or in conjunction with wires which are free thereof and exert their effect in combination with a cutting medium suspension. In particular, diamond may be envisioned as the abrasive grain. The wires in question here are sections of a wire which is wound around the wire guide rollers of the wire saw. The number of wire guide rollers of the wire saw is not essential for the use of the invention. For example, the wire saw may comprise two, three, four or an even greater number of wire guide rollers.

The workpiece preferably consists of a semiconductor material such as silicon, which may be present in the polycrystalline or monocrystalline state. The contour of the workpiece is square, rectangular or circular. The method according to the invention is suitable, in particular, for the production of round semiconductor wafers of monocrystalline silicon with a diameter of at least 200 mm, in particular at least 300 mm.

The object of the invention is furthermore achieved by a wire saw for producing semiconductor wafers by processing a workpiece, comprising
- wire guide rollers, between which wires are tensioned to form an arrangement of wires, which are divided into wire groups and move in a running direction;
- a device for feeding the workpiece through the arrangement of wires while producing kerfs when the wires engage into the workpiece;
- drive elements, at least one of which is assigned to each of the wire groups, for moving the wires of the assigned wire group; and
- a control unit for activating the drive elements, the control unit, when there is a placement error of the kerfs of the wire groups, activating that drive element which is assigned to the wire group, so that the wires of this wire group execute compensating movements perpendicularly to the running direction.

The wire saw comprises a device for feeding a workpiece through an arrangement of wires which are tensioned between wire guide rollers. The wire saw may comprise two or more wire guide rollers, around which the sawing wire is wound. In a wire saw according to the invention, the wires are divided into groups and at least one drive element is assigned to each of the wire groups. When a drive element is activated, the wires of the wire group assigned to it are moved perpendicularly to the running direction of the wires, i.e. in the direction of the rotation axes of the wire guide rollers. The activated drive element moves the wires of the wire group assigned to it simultaneously with the same magnitude in the same direction. Because of the assignment of the drive elements, the magnitude and the direction of the movement of the wires of one wire group are independent of the magnitude and the direction of the movement of the wires of another wire group. The wire guide rollers, between which the wires divided into wire groups are tensioned, so that they form the arrangement of wires, are provided with the drive elements. The drive elements are arranged between the wire groups of at least one of the wire guide rollers, between which the workpiece is fed through the arrangement of wires. It is not necessary, but also not ruled out, that the other wire guide rollers tensioning the wire web are likewise provided with such drive elements.

The wire saw furthermore comprises a control unit for activating the drive elements. When there is a placement error of the kerfs of a wire group, the control unit activates the drive element that is assigned to the wire group whereupon the wires of this wire group execute a compensating movement which reduces or eliminates the placement error of the kerfs which has been determined.

The control unit accesses either data relating to the placement error of the kerfs which have been provided during the feeding of the workpiece by means of a measuring apparatus according to the first configuration of the method, or wire saw-specific data which are stored in a database and have been provided before the feeding of the workpiece according to the second configuration of the method, or both of these data together.

The measuring apparatus is used, separately for each wire group, to determine the placement error of the kerfs of the respective wire group during the feeding of the workpiece through the arrangement of wires. The information relating to the placement error of the kerfs of the wire group is transmitted to the control unit and processed further there to form a signal (manipulated variable) for the activation of the drive element that is assigned to the corresponding wire group. The measuring apparatus and the control unit are components of a first closed control loop for minimizing the placement errors of the kerfs. By means of this control loop, for each wire group separately, the drive element assigned to the wire group is activated, independently of the optionally simultaneously induced activation of a drive element that is assigned to another of the wire groups.

The data memory is used for holding data relating to activation of the drive elements. The data form a wire saw-specific correction profile, specifically a separate one for each of the wire groups. Such a wire saw-specific correction profile specifies the direction and the magnitude of the compensating movements of the wires of the wire group as a function of the penetration depth of the wires into the workpiece. The control unit accesses this data during the feeding of the workpiece through the arrangement of wires, and activates the drive element assigned to the respective wire group according to the specifications of the wire saw-specific correction profile applicable to the wires of this wire group. Preferably, the data memory and the control unit are components of a further closed control loop for minimizing the placement errors of the kerfs.

If the wire saw has a data memory, a computation unit is preferably also provided for tracking changes in a wire saw-specific correction profile in the course of the processing of a plurality of workpieces. When an established threshold of the changes is reached, the computation unit outputs a signal for initiating a predictive maintenance measure.

The object of the invention is furthermore achieved by a semiconductor wafer of monocrystalline silicon, having an upper side surface and a lower side surface, comprising
- a warp of less than 1.2 μm;
- a nanotopography of the upper side surface, expressed as THA25 10%, of less than 5 nm; and
- a subsurface-referenced nanotopography of the upper side surface of less than 6 nm, expressed as a maximum peak-to-valley distance on a subsurface and referenced to subsurfaces with an area content of respectively 25 mm×25 mm.

The semiconductor wafer preferably has a diameter of at least 200 mm, more preferably a diameter of 300 mm. The above-indicated properties of the semiconductor wafer regarding warp, nanotopography and surface-referenced nanotopography relate to a semiconductor wafer with a diameter of 300 mm.

The warp of the semiconductor wafer is determined according to the standard SEMI MF 1390-0218.

In order to examine the nanotopography, an interferometer, for example an instrument of the type WaferSight™ from KLA-Tencor Corp., may be used. Such an interferometer is suitable for measuring the topography on the upper side surface of a semiconductor wafer. The instrument images a height map of the upper side surface of the semiconductor wafer, which is filtered and over which an analysis window with a defined analysis area is moved. The evaluation of the height differences in the analysis window is carried out by THA (threshold height analysis) according to method protocols established by the standards SEMI M43-0418 and SEMI M78-0618. THAXX 10%<5 nm means that at most 10% of the analyzed area of the upper side surface of the semiconductor wafer in the analysis window with the analysis area specified by XX may have a maximum PV distance (peak-to-valley metric) of 5 nm or more. For a semiconductor wafer according to the invention, the nanotopography of the upper side surface, expressed as THA25 10%, is less than 5 nm, an analysis window with a circular contour and a diameter of 25 mm being used and the unfiltered topography signal being filtered with a single Gaussian highpass filter with a cut-off wavelength of 20 mm. The cut-off wavelength decreases to 1 mm toward the edge of the semiconductor wafer. Before the filtering, an edge exclusion of 5 mm is allowed for, and after the filtering an edge exclusion of 15 mm.

During the measurement of the nanotopography of the upper side surface, the semiconductor wafer may be in the state after cutting from the workpiece or in a state following processing steps subsequent to the cutting, such as etching and polishing. Preferably, the upper side surface of the semiconductor wafer is in the polished state.

The nanotopography may also be evaluated in a subsurface-referenced fashion, i.e. with reference to user-specific subsurfaces (sites) of the upper side surface of the semiconductor wafer. The PV distance is determined as described above (analysis window with circular scope and a diameter of 25 mm, single Gaussian highpass filter, cut-off wavelength of 20 mm decreasing to 1 mm toward the edge of the semiconductor wafer). The edge exclusion however, is 2 mm before the filtering and 3 mm after the filtering. The upper side surface of the semiconductor wafer is subdivided into subsurfaces, which are grouped around a subsurface (site) whose lower left edge is arranged at the center of the upper side surface of the semiconductor wafer. For a semiconductor wafer according to the invention, the subsurface-referenced nanotopography of the upper side surface is less than 6 nm, expressed as a maximum PV distance on a subsurface and with reference to subsurfaces with an area content of 25 mm×25 mm.

The invention will be further explained below with reference to drawings.

LIST OF REFERENCES USED 1 sawing wire
2 grooves
3 left wire guide roller
4 right wire guide roller
5 axis
6 axis
7 rotation
8 rotation direction
9 longitudinal wire movement
10 longitudinal wire movement
11 wire web
12 feed device
13 kerf
14 axis
15 workpiece
16 sawing strip
17 adhesive
18 arrow direction
19 nozzle row
20 nozzle row
21 nozzles
22 jet
23 jet
24a-e drive element
25a-d wire group
26 fixed bearing
27 bearing
28 control unit
29 data specification
30 measuring apparatus
31 data memory
32 target trajectory FIG. 1 shows main features of a wire saw belonging to the prior art, and serves to explain the basics of a method for producing semiconductor wafers from a workpiece by processing the workpiece by means of a wire saw.

A suitable wire saw comprises sawing wire 1 which is passed several times spirally around a left wire guide roller 3 and a right wire guide roller 4 and is guided by grooves 2 in such a way that the wire sections running on the upper side of the wire guide rollers, which are referred to as wires for the description of the present invention, run parallel and form a wire web 11. A workpiece 15 is fastened on a sawing strip 16, for example by means of an adhesive 17. The sawing strip 16 is fed with the workpiece 15 by a feed device 12 (represented indicatively) in arrow direction 18 perpendicularly against the wire web 11 and is brought into engagement with the wires of the wire web 11. Optionally, the wire saw comprises left nozzle rows 19 and right nozzle rows 20 with nozzles 21 for delivering a cutting medium suspension in the form of a left elongated jet 22 and a right elongated jet 23 onto the left wire guide roller 3 and the right wire guide roller 4.

The wire guide rollers are mounted rotatably about axes 5 and 6. Their axes and the axis 14 of the workpiece 15—in the example shown a cylindrical ingot—are oriented parallel to one another. In order to initiate the cutting process, one wire guide roller, for example the left wire guide roller 3, is driven in rotation 7 (master). The other wire guide roller (slave), in the example the right wire guide roller 4, corotates, pulled by wire 1, in the same sense in the rotation direction 8. When the wires engage into the workpiece 15, kerfs 13 are formed.

Conventionally, the direction of the wire longitudinal movement 9, 10 is reversed several times during a full cut through the workpiece 15, wherein in each individual one of these pairs of direction changes of the wire, referred to as a reciprocating movement, the wire is moved by a greater length in one direction and a shorter length in the opposite direction.

Figure 2:
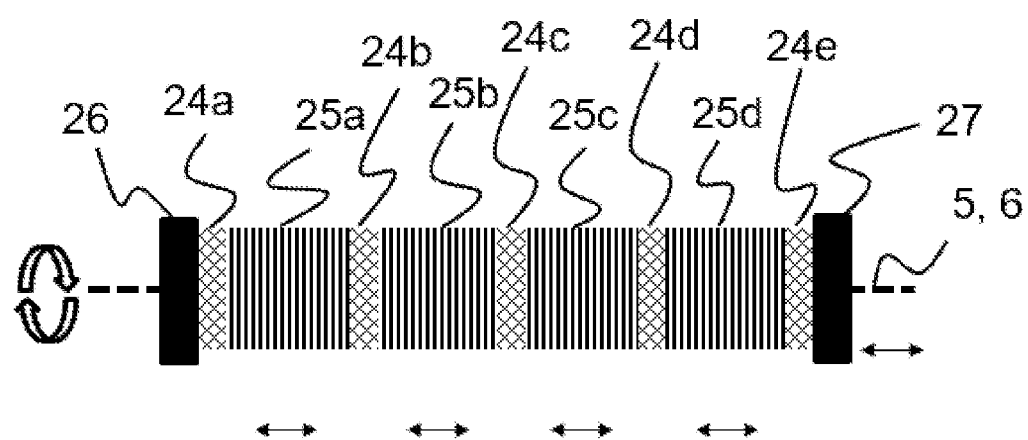
FIG. 2 shows features of a wire guide roller of a wire saw according to the invention.

A wire saw according to the invention has at least one wire guide roller, which comprises drive elements. An example of such a wire guide roller is represented in FIG. 2. When a drive element is activated, an activated wire group is moved in a direction perpendicular to the running direction of the wires of the wire group. In the example represented, five drive elements 24a-e and four wire groups 25a-d are provided between the fixed bearing 26 and the bearing 27 of the wire guide roller. The bearing 27 may be configured as a loose bearing or as a fixed bearing. The drive element 24e that is adjacent to the bearing 27 may be omitted if the bearing 27 is a loose bearing. Irrespective thereof, the bearing 27 is shown as a loose bearing in the example represented. The double arrows indicate possible movement directions, in which a wire group moves when the drive element assigned to it is activated. The wire guide roller may be subdivided into segments, provided with grooves for wires, which are arranged on a shaft, for example into segments such as are described in JP 11 123 649 A2. A drive element is then positioned between each end of the segments and adjacent to the fixed bearing. In such a structure, the wire guide roller represented in FIG. 2 has a number of segments which corresponds to the number of wire groups.

Figure 3:
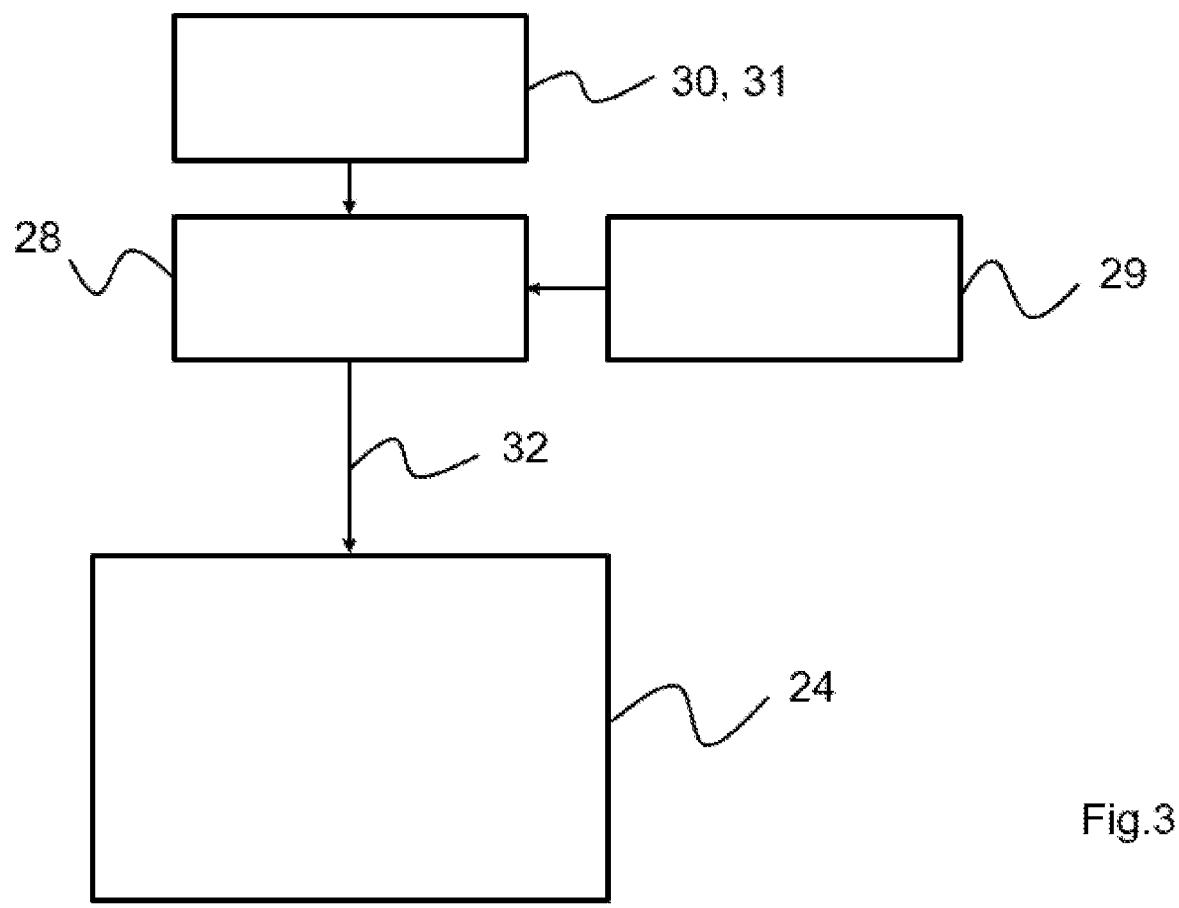
FIG. 3 shows schematically the procedure of the method according to the invention.

FIG. 3 schematically shows the procedure by which a control unit 28 acts on drive elements 24 on the basis of data relating to a placement error of the kerfs of a wire group with a correction signal 32 based on a correction profile and/or a wire saw-specific correction profile, so that the wires of the wire group 25 execute compensating movements. The control unit 28 receives the input required therefor from a measuring apparatus 30 and/or a data memory 31, in which the wire saw-specific correction profile is stored.

Figure 4:
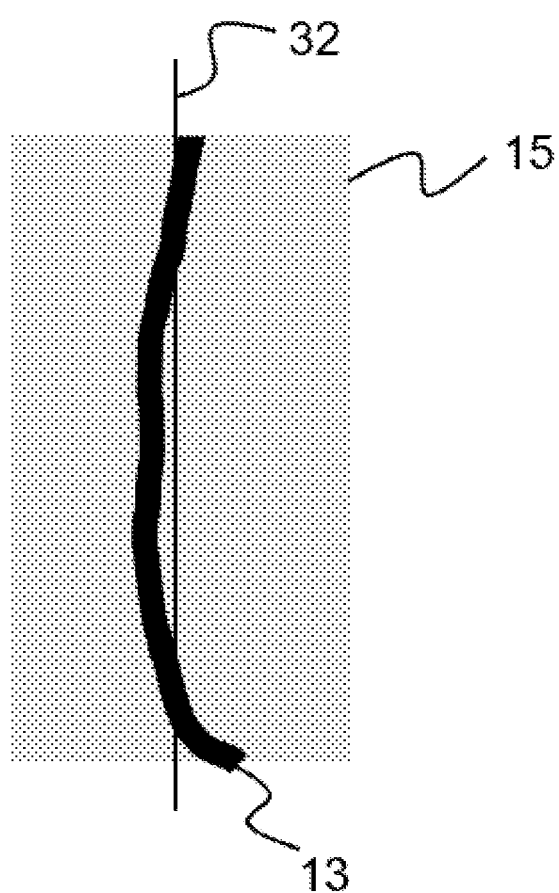
FIG. 4 shows the way in which an actual trajectory may differ through the middle of a kerf from a target trajectory.

FIG. 4 shows in cross section an image which may be obtained either by observing the kerfs or by observing the wires and the workpiece during the engagement of the wires into the workpiece. It shows a part of the workpiece 15, and a kerf 13 which extends through the workpiece. The actual trajectory, which extends through the middle of the kerf 13 deviates more or less significantly during the creation of the kerf from a target trajectory 32. The difference represents the ascertained placement error of the kerf 13. As mentioned, according to the invention, for each wire group, compensating movements of the wires of the wire group are induced as a function of the ascertained placement error of the kerfs of the wire group in a direction perpendicular to the running direction of the wires of the wire group, specifically by activating a drive element that is assigned to the respective wire group.

Figure 5:
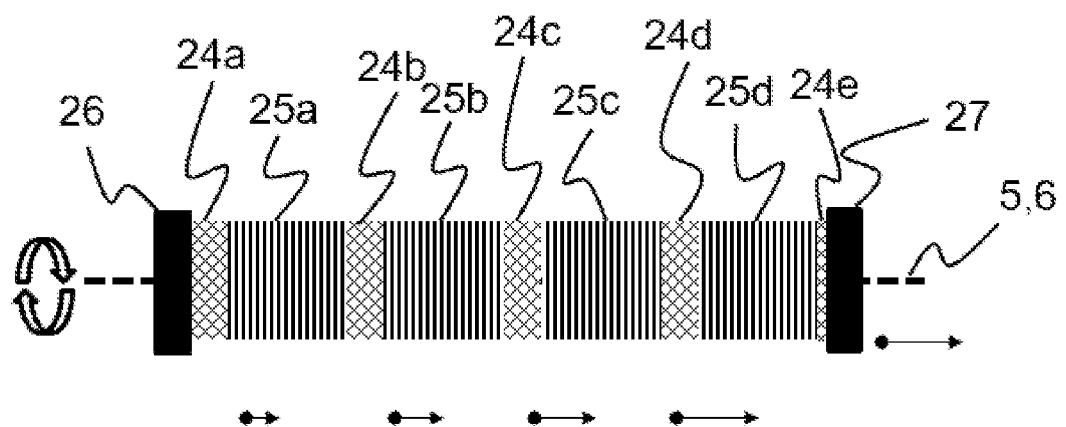
FIG. 5 and FIG. 6 show the direction and magnitudes of possible compensating movements of wire groups with reference to two examples.
Figure 6:
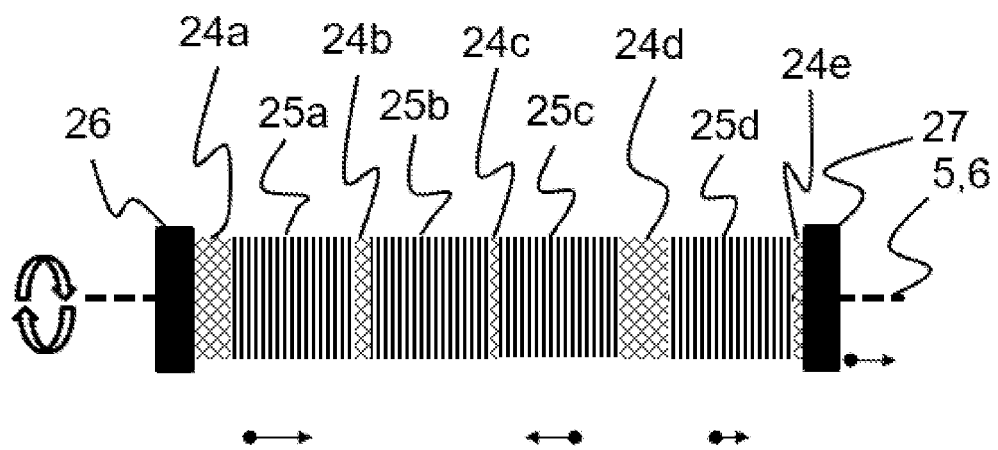

FIG. 5 and FIG. 6 show the direction and magnitudes of possible compensating movements of wire groups with reference to two examples. The drive elements 24*a-e* are, for example, piezoelectric actuators. In the case of FIG. 5, the effect of the same type of activation of the drive elements 24*a-d* shown in FIG. 2 is that the piezoelectric actuators respectively expand by the same magnitude, so that the wire groups 25*a-d* and the bearing 27 of the wire guide roller are correspondingly moved away from the fixed bearing 26. The magnitude of the compensating movement increases, as the arrows indicate, uniformly from the wire group 25*a* to the wire group 25*d*. It may, however, also be necessary for example that, as represented in FIG. 6, compensating movements are required in the course of which wire groups move toward one another. FIG. 6 shows the result when the drive elements shown in FIG. 2 are activated in such a way that the drive element 24*a* expands with a magnitude a and the drive element 24*d* expands with a magnitude d (magnitude d>magnitude a) toward the bearing 27, and the drive element 24*b* contracts with a magnitude b and the drive element 24*c* contracts with a magnitude c (magnitude c>magnitude d) toward the fixed bearing 26. Overall, the compensating movements of the wires of the wire group and of the bearing 27 indicated by arrows then take place: the wires of the wire group 25*a* are moved with the greatest magnitude toward the bearing 27, the wires of the wire group 25*b* are not moved, the wires of the wire group 25*c* are moved with a magnitude toward the fixed bearing 26, and the wires of the wire group 25*d* are moved with the smallest magnitude toward the bearing 27.

The comparison of the actual trajectory and the target trajectory according to the first configuration of the invention, or the comparison of the expected trajectory and the target trajectory according to the second configuration of the invention, leads to a description of the profile of the placement error of the kerfs of a wire group as a function of the penetration depth of the wires of the wire group in the workpiece and to a correction profile (first configuration of the invention) or to a wire saw-specific correction profile (second configuration of the invention), which are respectively complementary to the profile of the placement error of the kerfs.

Figure 7:
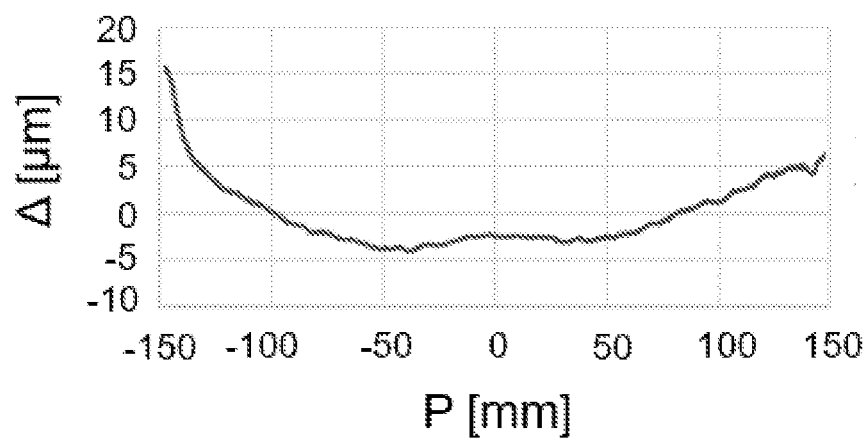
FIG. 7 shows a typical correction profile, on the basis of which compensating movements of the wires of a wire group are induced.
Figure 8:
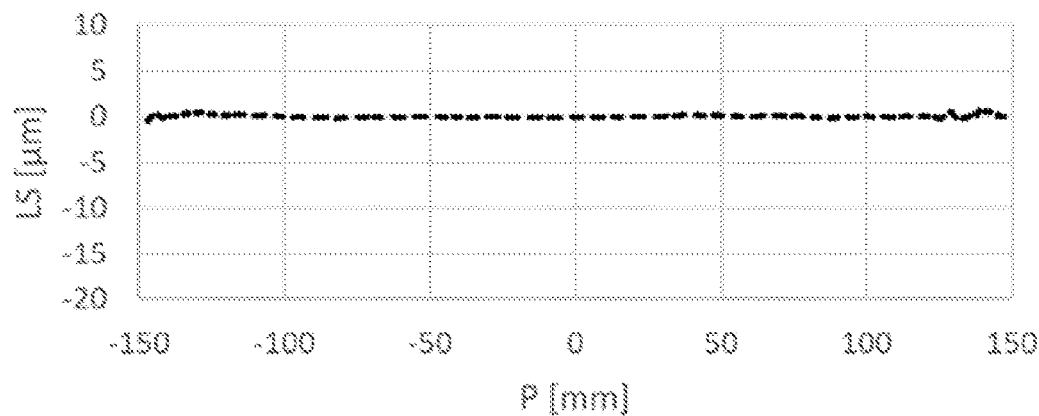
FIG. 8 to FIG. 10 and FIG. 11 to FIG. 13 show height lines, derived from median surfaces of a warp measurement, respectively of three semiconductor wafers.
Figure 9:
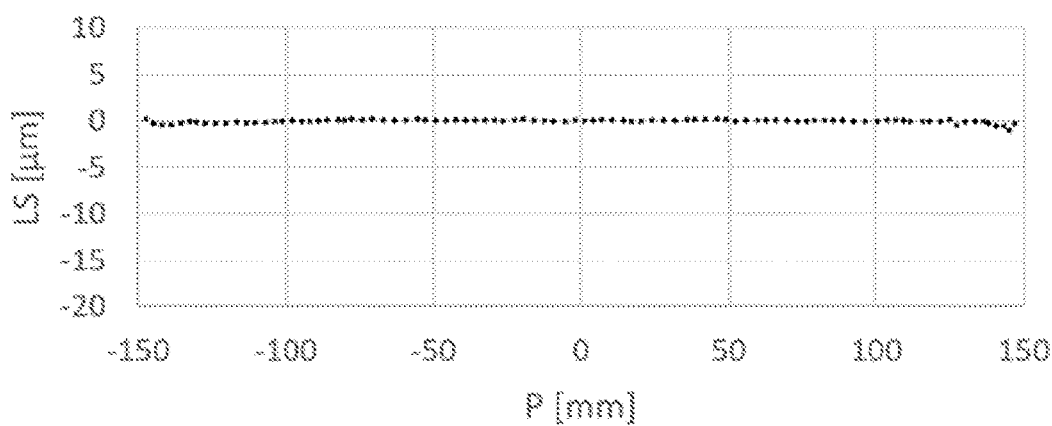
Figure 10:
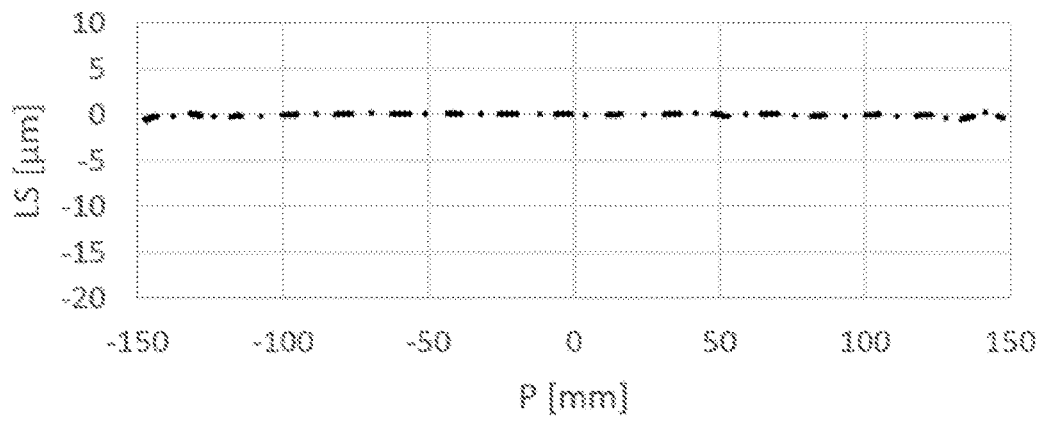

FIG. 7 shows a correction profile in which the deviation $\Delta$ of the actual trajectory from the target trajectory is plotted as a function of the penetration depth P of the wires of the wire group. Compensating movements of the wires of the wire group with a direction and a magnitude which corresponds to the deviation $\Delta$ are induced by means of activating the drive element assigned to the wire group. Only when there is no placement error of the kerfs ($\Delta=0$), which in the example shown is not the case approximately until a penetration depth of −100 mm, is the inducing of such compensating movements stopped.

Figure 11:
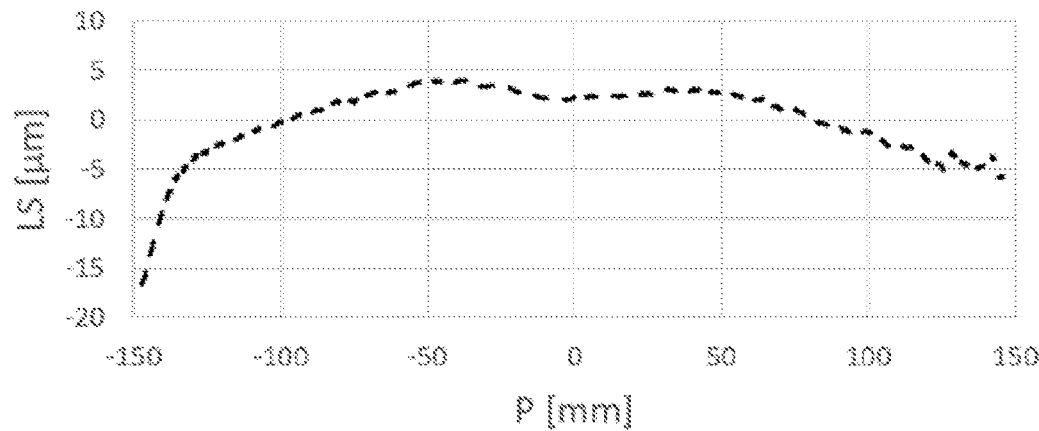
Figure 12:
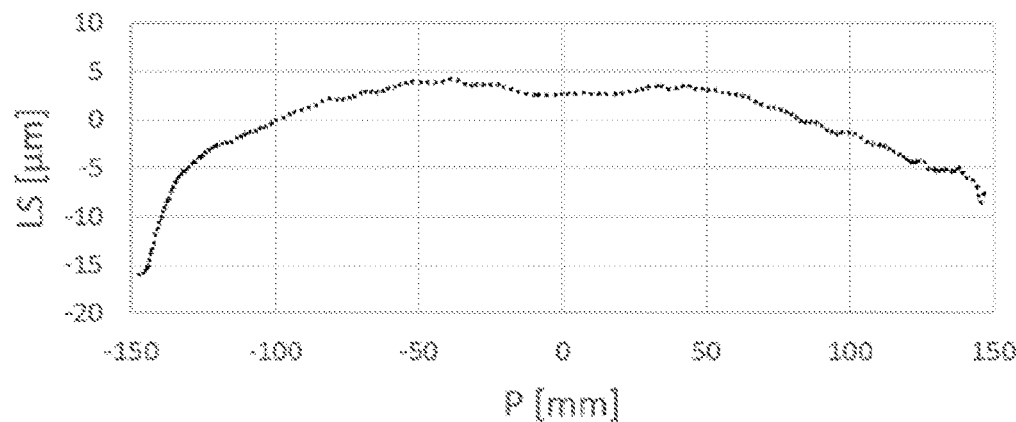
Figure 13:
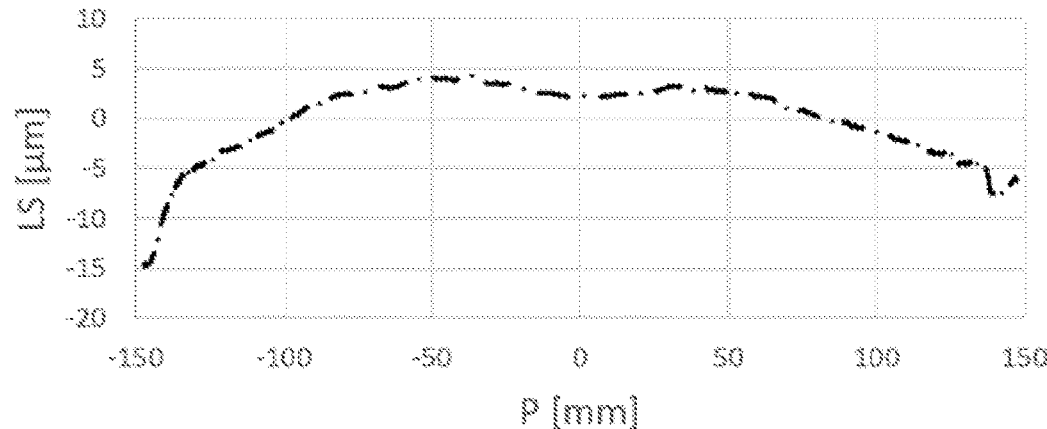
Figure 14:
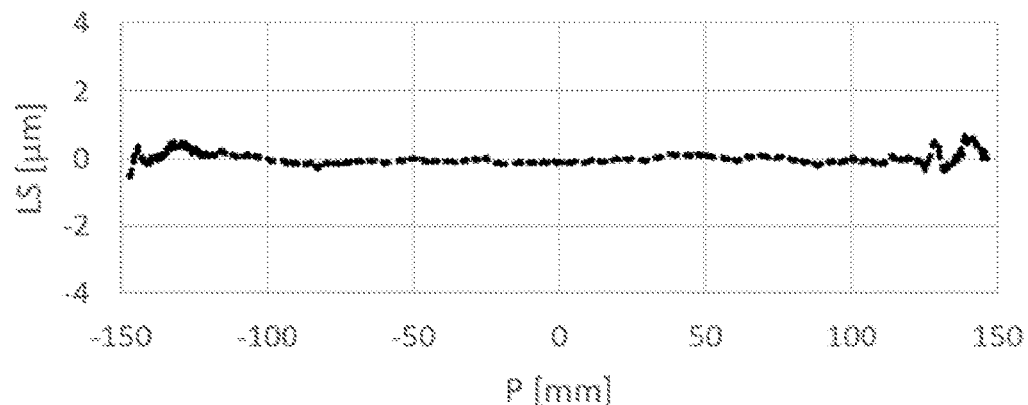
FIG. 14 to FIG. 16 correspond to FIG. 8 to FIG. 10 with the difference of more highly resolved scaling of the ordinate.
Figure 15:
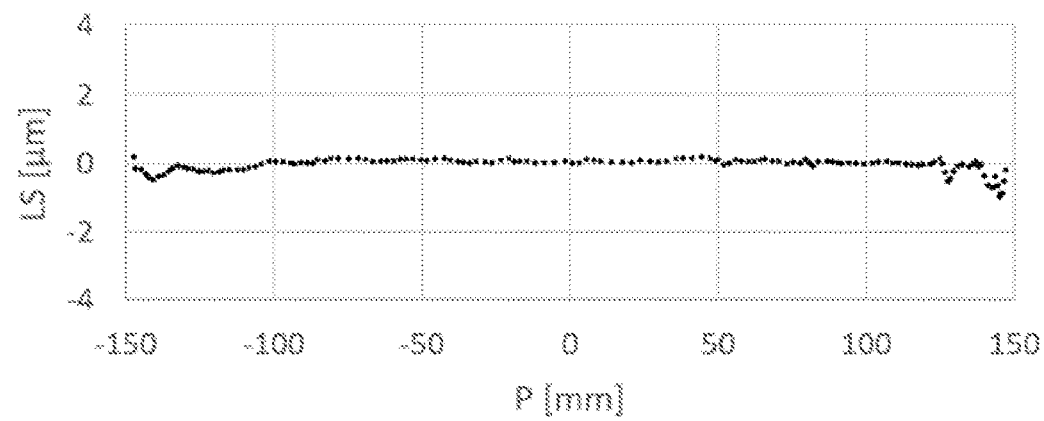
Figure 16:
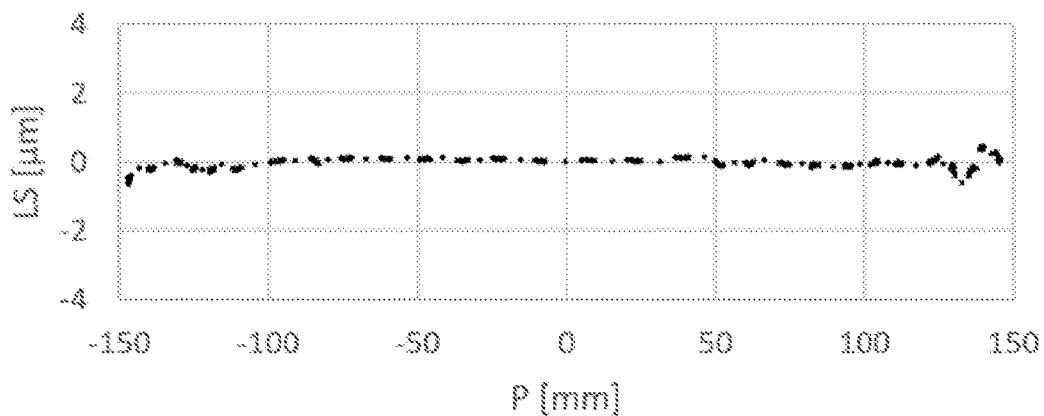

FIG. 8 to FIG. 13 show height lines LS respectively of three semiconductor wafers, which have been cut from a workpiece by wires of a wire group, compensating movements of the wires of the wire group, specified by the correction profile, having been induced during the cutting of the semiconductor wafers (FIG. 8 to FIG. 10), or the inducing of such compensating movements having been omitted (FIG. 11 to FIG. 13). The height lines are respectively derived from the median surface of a warp measurement, with measurement values of the median surface having been selected which lie on a line that follows the diameter of the respective semiconductor wafer in the direction of the workpiece during the cutting of the semiconductor wafer. The position of the semiconductor wafers in the workpiece was such that further semiconductor wafers were formed between each of the three semiconductor wafers 50 when cutting the semiconductor wafers. As the comparison of the height lines reveals, semiconductor wafers when using the invention are significantly more planar, and without a particular influence of their position in the workpiece. This is also confirmed by FIG. 14 to FIG. 16, which differ from FIG. 8 to FIG. 10 only in that the scaling of the ordinate is more highly resolved in them.

Figure 17:
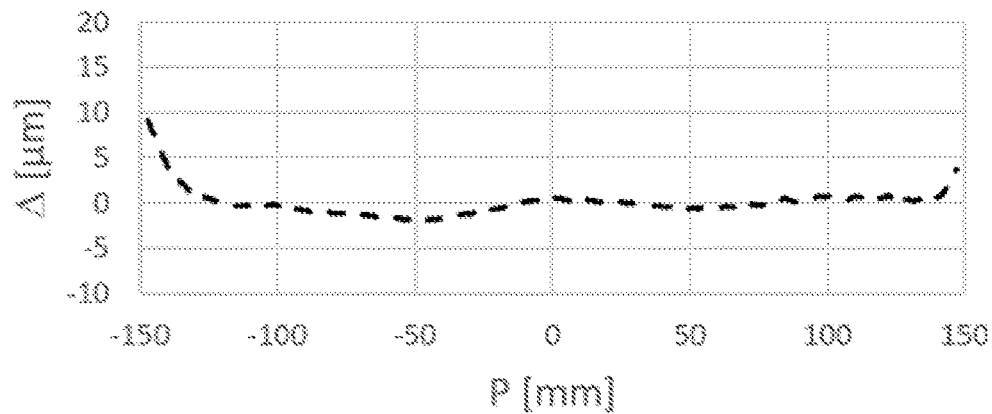
FIGS. 17, 18 and 19 show the way in which a wire saw-specific correction profile may vary in the course of the processing of a plurality of workpieces.
Figure 18:
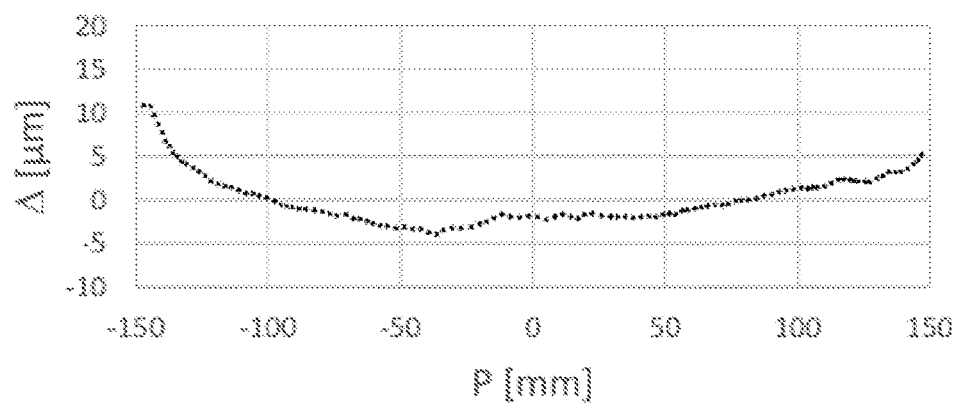
Figure 19:
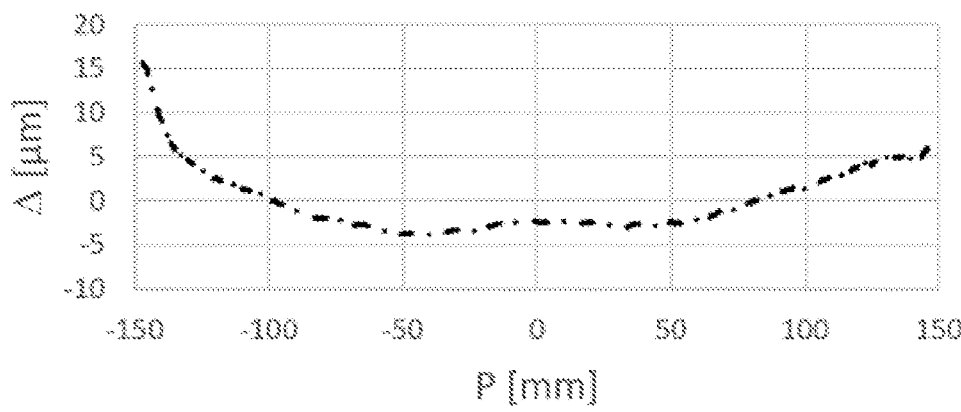

FIGS. 17, 18 and 19 show the way in which a wire saw-specific correction profile may vary constantly in the course of the processing of a plurality of workpieces. It is therefore advantageous to define a threshold for the deviation $\Delta$, predictive maintenance measures being initiated when it is exceeded. The threshold may, for example, be defined in such a way that only a wire saw-specific correction profile with a maximum deviation $\Delta_{max}$, as is represented in FIG. 19, leads to predictive maintenance measures being initiated.

The features specified in relation to the aforementioned embodiments of the method according to the invention may be applied correspondingly to the apparatus according to the invention. Conversely, the features specified in relation to the aforementioned embodiments of the apparatus according to the invention may be applied correspondingly to the method according to the invention. These and other features of the embodiments according to the invention are explained in the description of the figures and in the claims. The individual features may be implemented either separately or in combination as embodiments of the invention. Furthermore, they may describe advantageous embodiments which are independently protectable.

The preceding description of examples of embodiments is to be understood as exemplary. The disclosure thereby made on the one hand allows the person skilled in the art to understand the present invention and the advantages associated therewith, and on the other hand in the understanding of the person skilled in the art also comprises obvious changes and modifications to the described structures and methods. All such changes and modifications as well as equivalents are therefore intended to be covered by the scope of protection of the claims.

The invention claimed is:

1. A method for producing semiconductor wafers from a workpiece by processing the workpiece by means of a wire saw, comprising:

feeding the workpiece through an arrangement of wires which are tensioned between wire guide rollers while being divided into wire groups and move in a running direction;

producing kerfs when the wires engage the workpiece;

for each of the wire groups, determining a placement error of the kerfs of the wire group; and for each of the wire groups, inducing a compensating movement of the wires of the wire group independently of other wire groups as a function of the determined placement error of the kerfs of the wire group, in a direction perpendicular to a running direction of the wires of the wire group during the feeding of the workpiece through the arrangement of wires, by activating at least one wire group drive element.

2. The method of claim 1, further comprising dividing the wires into no fewer than three wire groups and at most a number of wire groups which corresponds to the number of wires of the arrangement.

3. The method of claim 1, wherein comprising determining the placement error of the kerfs is determined during the feeding of the workpiece through the arrangement of wires.

4. The method of claim 1, wherein the placement error of the kerfs of the wire group is determined by measuring the position of the kerfs of the wire group by means of irradiating the kerfs of the wire group with optical radiation, IR radiation, X-radiation or γ radiation, by mechanical sensing of the kerfs, or by inductive or capacitive measurement of the kerfs, and comparing the measured position with a setpoint position of the kerfs.

5. The method of claim 1, wherein the placement error of the kerfs of the wire group is determined by simultaneously measuring the position of the wires of the wire group and of the workpiece relative to a fixed reference point by means of irradiation with optical radiation, IR radiation, X-radiation or γ radiation, by capacitive or inductive measurement or by mechanical sensing, and comparing the measured position with a respective setpoint position.

6. The of claim 1, further comprising tracking changes in a wire saw-specific correction profile in a course of processing a plurality of workpieces, and initiating a predictive maintenance measure if the changes have reached an established threshold.

7. The method of claim 6, comprising determining the placement error of the kerfs by measuring the local geometry of semiconductor wafers which have been produced beforehand by means of the wire saw, in order to compile a wire saw-specific correction profile.

8. A wire saw for producing semiconductor wafers by processing a workpiece, comprising:

wire guide rollers, between which wires are tensioned to form an arrangement of wires which move in a running direction and, are divided into wire groups;

a feed device for feeding the workpiece through the arrangement of wires, producing kerfs as the wires engage the workpiece;

drive elements, at least one of which is assigned to each of the wire groups, which move the wires of the assigned wire group; and a control unit which activates the drive elements in response to a determined placement error of the kerfs of the wire groups, the control unit activating the at least one drive element, which is assigned to the wire group having the determined placement error, so that the wires of the wire group execute a compensating movement independent of other wire groups perpendicular to the running direction.

9. The wire saw of claim 8, further comprising a measuring apparatus which determines the determined placement error of the kerfs of a respective wire group during feeding of the workpiece, the measuring apparatus and the control unit being pat of a closed control loop.

10. The wire saw of claim 8, further comprising a data memory in which a wire saw-specific correction profile is stored for the wires of each of the wire groups, and which the control unit accesses in order to activate the drive elements during the feeding of the workpiece.

11. The wire saw of claim 10, further comprising a tracking unit which tracks changes in the wire saw-specific correction profile in the course of the processing of a plurality of workpieces, and which outputs a signal for initiating a predictive maintenance measure if the changes have reached an established threshold.

* * * * *

UNITED STATES PATENT AND TRADEMARK OFFICE
CERTIFICATE OF CORRECTION

PATENT NO. : 12,083,705 B2
APPLICATION NO. : 17/414680
DATED : September 10, 2024
INVENTOR(S) : Axel Beyer et al.

Page 1 of 1

It is certified that error appears in the above-identified patent and that said Letters Patent is hereby corrected as shown below:

In the Claims

Column 14, Line 30, Claim 9:
After "and the control unit being"
Delete "pat" and
Insert -- part --.

Signed and Sealed this
Third Day of June, 2025

Coke Morgan Stewart
*Acting Director of the United States Patent and Trademark Office*